United States Patent
Lu

(10) Patent No.: US 12,464,748 B2
(45) Date of Patent: Nov. 4, 2025

(54) INSULATED GATE BIPOLAR TRANSISTOR

(71) Applicant: FUJI ELECTRIC CO., LTD., Kawasaki (JP)

(72) Inventor: Hong-fei Lu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 392 days.

(21) Appl. No.: 18/138,956

(22) Filed: Apr. 25, 2023

(65) Prior Publication Data
US 2023/0420549 A1    Dec. 28, 2023

(30) Foreign Application Priority Data

Jun. 28, 2022    (JP) ................................. 2022-103694

(51) Int. Cl.
| | | |
|---|---|---|
| *H10D 12/00* | (2025.01) | |
| *H10D 62/13* | (2025.01) | |
| *H10D 62/60* | (2025.01) | |
| *H10D 64/27* | (2025.01) | |

(52) U.S. Cl.
CPC ......... *H10D 12/481* (2025.01); *H10D 62/133* (2025.01); *H10D 62/60* (2025.01); *H10D 64/513* (2025.01)

(58) Field of Classification Search
CPC .... H10D 12/481; H10D 62/133; H10D 62/60; H10D 64/513; H10D 12/038; H10D 62/393; H10D 62/127; H10D 64/117; H10D 62/106
See application file for complete search history.

(56) References Cited

U.S. PATENT DOCUMENTS

| | | |
|---|---|---|
| 6,469,344 B2 | 10/2002 | Iwamuro et al. |
| 6,809,349 B2 | 10/2004 | Yamaguchi et al. |
| 7,078,740 B2 | 7/2006 | Yamaguchi et al. |
| 7,170,106 B2 | 1/2007 | Yamaguchi et al. |
| 7,319,257 B2 | 1/2008 | Yamaguchi et al. |
| 9,478,614 B2 | 10/2016 | Onozawa et al. |
| RE47,198 E | 1/2019 | Yamaguchi et al. |
| 10,930,771 B2 | 2/2021 | Nagata |
| 2002/0053696 A1* | 5/2002 | Iwamuro .............. H10D 12/481 257/329 |

(Continued)

FOREIGN PATENT DOCUMENTS

| | | |
|---|---|---|
| JP | 2000-183340 A | 6/2000 |
| JP | 2004-153112 A | 5/2007 |

(Continued)

*Primary Examiner* — Syed I Gheyas

(57) ABSTRACT

IGBT includes an n-type drift layer, an n-type accumulation layer provided on the upper surface of the drift layer having higher impurity concentration than the drift layer, a base layer provided on the upper surface of the accumulation layer, a gate electrode embedded inside a striped gate trench penetrating the base layer and the storage layer through a gate insulating film, and a dummy electrode embedded inside a dummy trench provided to face the gate trench across the base layer and the accumulation layer through a dummy insulating film. The base layer has a p-type active base region and a p-type floating base region arranged alternately in the extending direction of the gate trench, and an n-type base isolation region isolating the active base region and the floating base region.

11 Claims, 12 Drawing Sheets

(56) References Cited

U.S. PATENT DOCUMENTS

| | | | |
|---|---|---|---|
| 2004/0041171 A1* | 3/2004 | Ogura | H10D 62/106 |
| | | | 257/E29.066 |
| 2004/0084722 A1* | 5/2004 | Yamaguchi | H10D 12/421 |
| | | | 257/E21.384 |
| 2004/0207009 A1 | 10/2004 | Yamaguchi et al. | |
| 2006/0006409 A1 | 1/2006 | Yamaguchi et al. | |
| 2007/0114570 A1 | 5/2007 | Yamaguchi et al. | |
| 2015/0349103 A1* | 12/2015 | Onozawa | H10D 62/127 |
| | | | 257/144 |
| 2019/0181254 A1* | 6/2019 | Nagata | H10D 64/232 |

FOREIGN PATENT DOCUMENTS

| | | |
|---|---|---|
| JP | 5987990 B | 8/2016 |
| JP | 2019-102759 A | 6/2019 |
| JP | 2020-191439 A | 11/2020 |

* cited by examiner

| ACCUMULATION LAYER CONCENTRATION | $n_{CS}$ : 9×10$^{16}$cm$^{-3}$ | | | $n_{CS}$ : 9×10$^{15}$cm$^{-3}$ | | |
|---|---|---|---|---|---|---|
| STRUCTURE | COMPARATIVE EXAMPLE 2 | COMPARATIVE EXAMPLE 1 | EXAMPLE | COMPARATIVE EXAMPLE 2 | COMPARATIVE EXAMPLE 1 | EXAMPLE |
| BASE REGION POTENTIAL | EMITTER | FLOATING | FLOATING | EMITTER | FLOATING | FLOATING |
| Von (V) | 1.604 | 1.513 | 1.56 | 1.836 | 1.695 | 1.715 |
| $E_{on}+E_{rr}$ (mJ/pulse @ 5kV/μs) | 20.1 | 20.1 | 20.8 | 26.95 | 20.27 | 24.99 | ized
INSULATED GATE BIPOLAR TRANSISTOR

CROSS REFERENCE TO RELATED APPLICATIONS

This application is based upon and claims the benefit of priority from the prior Japanese Patent Application No. P2022-103694 filed on Jun. 28, 2022, the entire contents of which are incorporated herein by reference.

BACKGROUND OF THE INVENTION

1. Field of the Invention

This invention relates to a trench gate insulated gate bipolar transistor (IGBT).

2. Description of the Related Art

Trench gate IGBTs can increase channel density and decrease on-voltage. Furthermore, it is possible to achieve the decrease of the on-voltage of the IGBT by separating the p-type base layer with the gate trench into the active base region connected to the emitter potential and the floating base region at the floating potential to promote carrier injection. During turn-off, the carrier holes accumulated in the floating base region are extracted through the extraction path at the bottom of the gate trench, resulting in poor turn-off characteristics.

JP 2000-183340 A discloses a structure in which the floating base region at floating potential and the active base region connected to emitter potential are alternately arranged in a stripe-shaped mesa extending along the gate trench in the direction of mesa extension. The current density and saturation current can be easily adjusted by the distance from the floating base region, the width of the floating base region and the like, starting with the width adjustment of the mesa in the extending direction of the emitter region located in the upper portion of the active base region. In addition, the on-voltage can be decreased by the injection enhancement (IE) effect by the floating base region. During turn-off, the hole extraction path can be formed not only at the bottom of the gate trench but also on the side face of the trench between the floating base region and the active base region in the mesa, preventing the potential change of the floating base region and reducing the turn-off loss. However, during turn-on, it is difficult to control the turn-on speed because the hole extraction path is less likely to form between the floating base region and the active base region.

JP 5987990 B discloses a structure in which the base region is separated by the gate trench and the dummy trench connected to the emitter potential. The first base region is disposed between the gate trenches, the second base region is disposed between the dummy trenches, and the floating base region is disposed between the gate trench and the dummy trench. Each of the first and second base regions is connected to the emitter potential, and the floating base region is at floating potential. In the on-state, the on-voltage is decreased due to the IE effect by the floating base region. During the turn-off, the hole extraction path is formed around the gate trench and the dummy trench, and during the turn-on process, the extraction path around the dummy trench remains. Therefore, the switching loss can be improved by moderating the potential change in the floating base region during the switching process.

In the structure disclosed in JP 5987990 B, when the n-type accumulation layer with a higher concentration than the drift layer is provided under the base region, it is possible to decrease the on-voltage by the floating base region. However, the hole extraction path is difficult to form, the voltage change rate dV/dt and the loss control during switching deteriorate. Therefore, in JP 2020-191439 A, a structure that eliminates the floating base region and connects to the emitter potential is disclosed. In addition, it is difficult to adjust the ratio of the mirror capacitance $C_{GC}$ between the gate and collector and the input capacitance $C_{GE}$ between the gate and emitter by the surface cell arrangement, making it difficult to meet different application needs (for example, dV/dt control).

SUMMARY OF THE INVENTION

An aspect of the present invention inheres in an insulated gate bipolar transistor, including: (a) a drift layer of a first conductivity type; (b) an accumulation layer of the first conductivity type arranged on an upper surface of the drift layer, having an impurity concentration higher than an impurity concentration of the drift layer; (c) a base layer arranged on an upper surface of the accumulation layer; (d) a gate electrode embedded through a gate insulating film inside a stripe-shaped gate trench penetrating the base layer and the accumulation layer; (e) a dummy electrode embedded through a dummy insulating film inside a stripe-shaped dummy trench penetrating the base layer and the accumulation layer; and (f) an emitter region of the first conductivity type arranged in an upper portion of the base layer, having a higher impurity concentration than the drift region, wherein the base layer includes an active base region of a second conductivity type in which the emitter region is arranged in the upper portion, connected to emitter potential, a floating base region of the second conductivity type set at floating potential, and a base isolation region of the first conductivity type isolating the active base region and the floating base region, and in a mesa provided between the gate trench and the dummy trench, the active base region and the floating base region are alternately arranged via the base isolation region in an extending direction of the gate trench.

DETAILED DESCRIPTION

Figure 1:
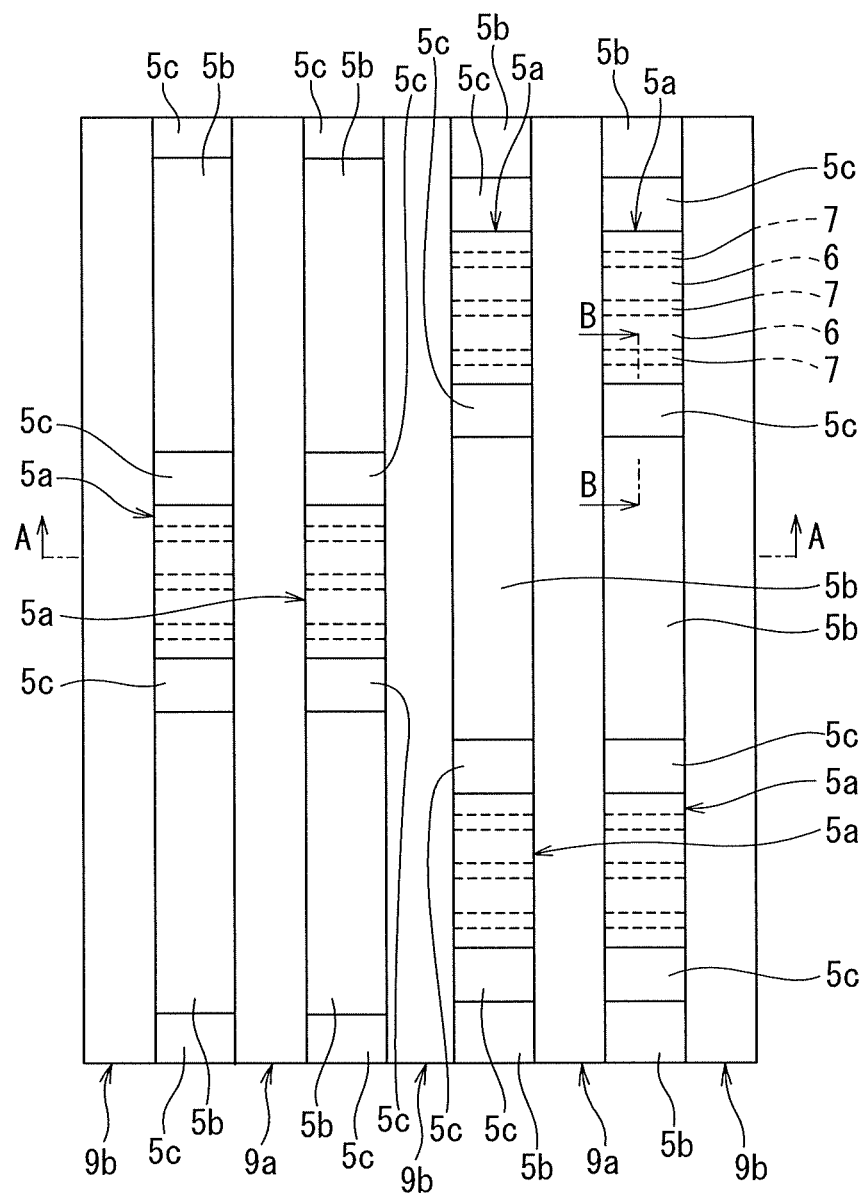
FIG. 1 is a schematic plan view illustrating an example of a layout of a base region of an IGBT according to an embodiment.

Exemplary embodiments of the present invention will be described below with reference to the drawings. In the following description of the drawings, the same or similar parts are denoted by the same or similar reference numerals. However, it should be noted that the drawings are schematic, the relationship between the thickness and the planar dimension, the ratio of the thickness of each device and each member, etc. may be different from the actual one. Therefore, specific thicknesses and dimensions should be determined with reference to the following description. In addition, it should also be understood that the respective drawings are illustrated with the dimensional relationships and proportions different from each other.

In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top". In the following description, the case where the first conductivity type is n type and the second conductivity type is p type will be described as an example. However, the conductivity type may be selected in an inverse relationship so that the first conductivity type may be p type and the second conductivity type may be n type. In addition, + or − attached to n or p means that the semiconductor region is relatively high or low in impurity density as compared with the semiconductor region to which + and − are not added. However, even semiconductor regions with the same n and n do not mean that the impurity densities of the respective semiconductor regions are strictly the same.

FIG. 1 is a schematic plan view illustrating a layout of a base layer (5a, 5b), a base isolation region 5c and a trench (9a, 9b) of the IGBT according to the first embodiment of the present invention. As illustrated in FIG. 1, the trench (9a, 9b) is composed of a stripe-shaped gate trench 9a and a stripe-shaped dummy trench 9b disposed in parallel with the gate trench 9a, in plan view. The gate trench 9a and the dummy trench 9b are alternately disposed side by side, and the base layer (5a, 5b) and the base isolation region (5c) are disposed between the gate trench 9a and the dummy trench 9b. In the base layer (5a, 5b) and the base isolation region (5c), in plan view, an active base region and a floating base region 5b are alternately disposed in an extending direction of the trench (9a, 9b), and the active base region 5a and the floating base region 5b are isolated by the base isolation region 5c. That is, in a mesa provided between the gate trench 9a and the dummy trench 9b adjacent to the gate trench 9a, the active base region 5a and the floating base region 5b are alternately disposed via the base isolation region 5c. In a direction perpendicular to the extending direction of the trench (9a, 9b), the active base region 5a faces the adjacent active base region 5a across the gate trench 9a and the floating base region 5b across the dummy trench 9b. In addition, the active base region 5a may be arranged to face the floating base region across the dummy trench 9b and to face the floating base region 5b across the gate trench 9a. The location of the active base region 5a projected in the direction perpendicular to the extending direction of the trench (9a, 9b) is included within the floating base region 5b.

As illustrated in FIG. 1, an emitter region 6 and a low-resistance base contact region 7 are selectively arranged in an upper portion of the active base region 5a. Both the emitter region 6 and the low-resistance base contact region 7 are arranged in contact with opposing sides of the gate trench 9a and the dummy trench 9b, respectively. The base isolation region 5c is arranged to face the low-resistance base contact region 7 through the active base region 5a in the extending direction of the trench (9a, 9b). In other words, in the extending direction of the trench (9a, 9b), the low-resistance base contact region 7 is provided to cover both sides of the emitter region 6 and to be closer to the base isolation region 5c than the emitter region 6. In FIG. 1, two emitter regions 6 sandwiched between the low-resistance base connection regions 7 are placed in the extending direction of the trench (9a, 9b). The number of emitter regions 6 is not limited, and may be three or more, or a single. In addition, neither the emitter region 6 nor the low-resistance base contact region 7 is placed in the floating base region 5b. A contact region is formed to partially contact the emitter region 6 and enclose the low-resistance base contact region 7, in which an ohmic junction is formed between an emitter electrode 13 and a semiconductor surface.

Figure 2:
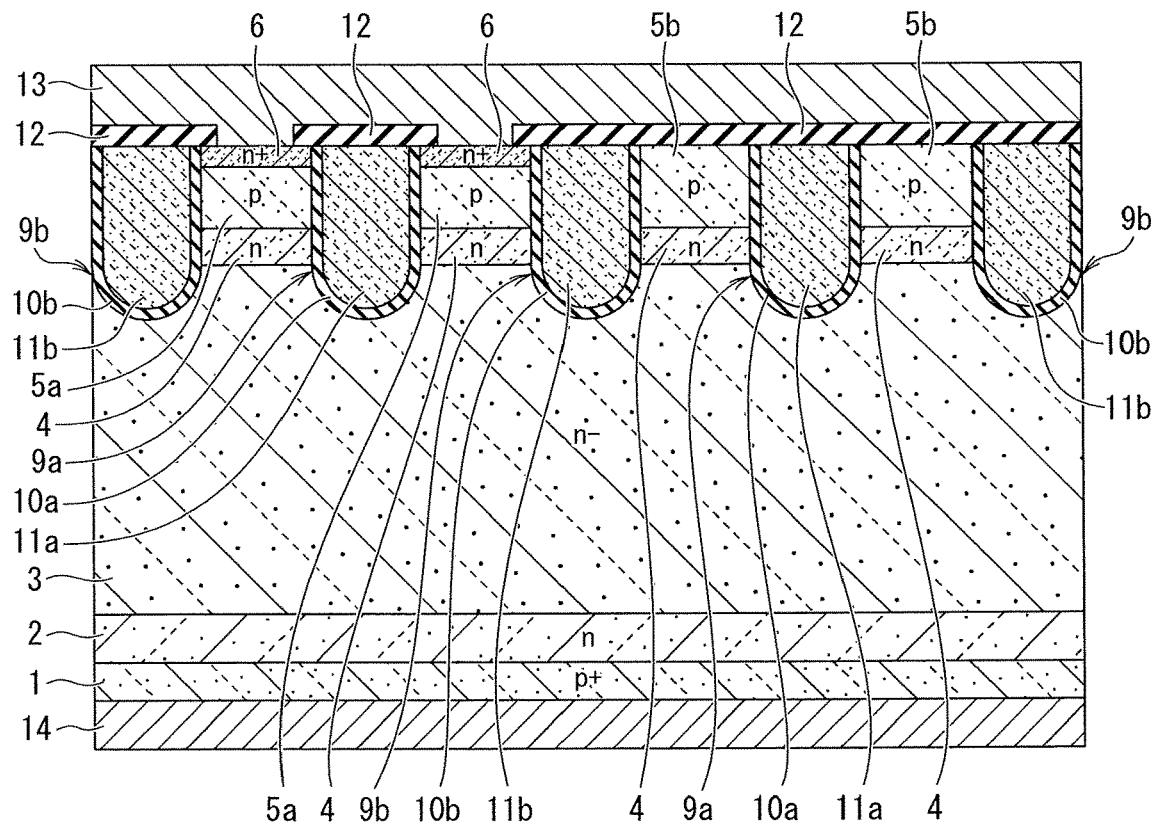
FIG. 2 is a schematic cross-sectional view taken along line A-A in FIG. 1.
Figure 3:
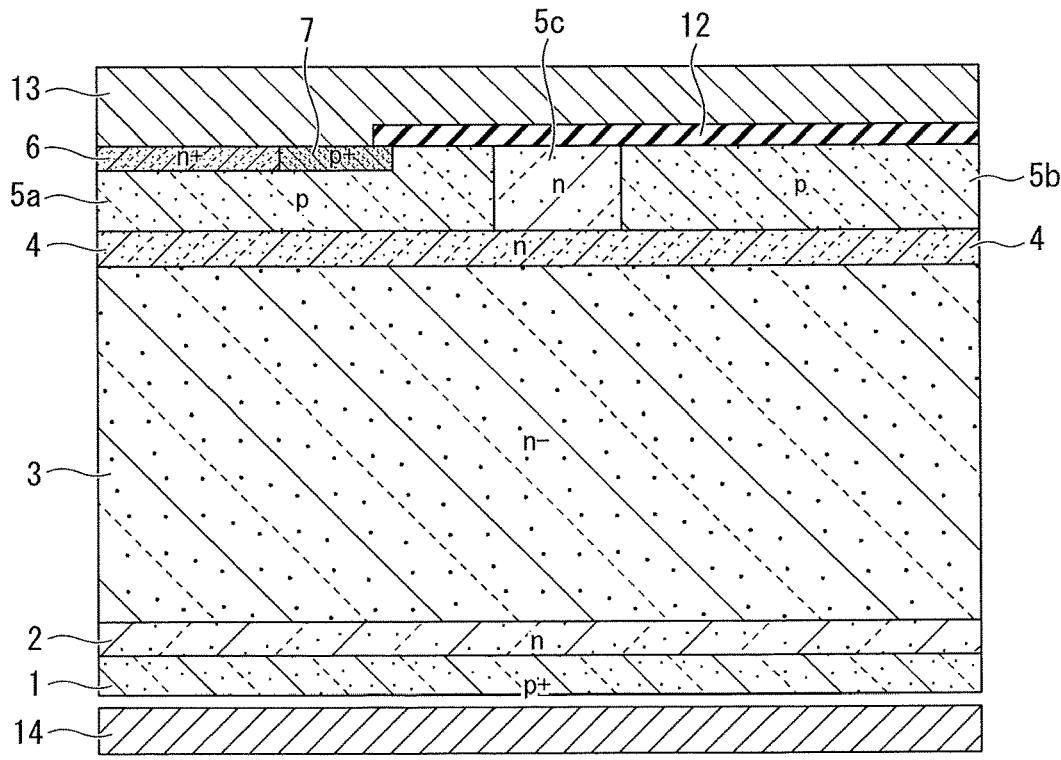
FIG. 3 is a schematic cross-sectional view taken along line B-B in FIG. 1.

FIG. 2 is a cross-sectional view cut in the direction perpendicular to the extending direction of the trench (9a, 9b), and FIG. 3 is a cross-sectional view cut in the extending direction of the trench (9a, 9b). As illustrated in FIGS. 2 and 3, a first conductivity type (n-type) accumulation layer 4 having a higher impurity concentration than an n⁻-type drift layer 3 is located on an upper surface of the drift layer 3, and the base layer (5a, 5b) and the base isolation region 5c are located on an upper surface of the accumulation layer 4. The base layer (5a, 5b) has a second conductivity type (p-type) active base region 5a and the p-type floating base region 5b. The base isolation region 5c is of the first conductivity type (n-type). The n-type base isolation region 5c has an impurity concentration higher than or equal to the impurity concentration of the drift layer 3 and less than or equal to the impurity concentration of the accumulation layer 4. For example, the drift layer 3 has the impurity concentration of about $3\times10^{13}$ cm$^{-3}$ and the accumulation layer 4 has the impurity concentration in a range of $5\times10^{15}$ cm$^{-3}$ or more and $1\times10^{17}$ cm$^{-3}$ or less, preferably in a range of $1\times10^{16}$ cm$^{-3}$ or more and $1\times10^{17}$ cm$^{-3}$ or less. In the upper portion of the active base region 5a, the n$^+$-type emitter region 6 having a higher impurity concentration than the drift layer 3 and the p$^+$-type low-resistance base contact region 7 having a higher impurity concentration than the active base region 5a are arranged. As illustrated in FIG. 1, the emitter region 6 and the low-resistance base contact region 7 are alternately disposed in the extending direction in which the trench (9a, 9b) extends in parallel. The emitter region 6 and the low-resistance base contact region 7 are connected to emitter potential. More specifically, the active base region 5a is connected to the emitter potential via the low-resistance base contact region 7. In addition, the floating base region is set at floating potential.

The trench (9a, 9b) is provided from upper surfaces of the base layer (5a, 5b) and the base isolation region (5c) penetrating the accumulation layer 4. The base layer (5a, the base isolation region (5c) and the accumulation layer 4 are in contact with each side of the trench (9a, 9b), and a part of the drift layer 3 is also in contact with each side of the trench (9a, 9b). As illustrated in FIG. 2, a gate insulating film 10a is formed on a bottom and the sides of the gate trench 9a. A gate electrode 11a connected to the gate potential is embedded inside the gate trench 9a via the gate insulating film 10a. A dummy insulating film 10b is formed on a bottom and the sides of the dummy trench 9b. A dummy electrode 11b connected to the emitter potential is embedded inside the dummy trench 9b via the dummy insulating film 10b.

For the gate insulating film 10a and the dummy insulating film 10b, in addition to a silicon dioxide ($SiO_2$) film, a silicon oxynitride (SiON) film, a strontium oxide (SrO) film, a silicon nitride ($Si_3N_4$) film, an aluminum oxide ($Al_2O_3$) film, a magnesium oxide (MgO) film, a yttrium oxide ($Y_2O_3$) film, a hafnium oxide ($HfO_2$) film, a zirconium oxide ($ZrO_2$) film, a tantalum oxide ($Ta_2O_5$) film, a bismuth oxide ($Bi_2O_3$) film and the like, may be adopted. Moreover, a single-layer film of any one of the above-mentioned dielectric films or a composite film in which the plural dielectric films are laminated, may be adopted. For each material of the gate electrode 11a and the dummy electrode 11b, for example, a polysilicon layer, or a doped polysilicon layer doped with impurities such as phosphorus (P) and boron (B) at a high concentration, can be used.

As illustrated in FIGS. 2 and 3, an interlayer insulating film 12 is arranged on each of the gate electrode 11a and the dummy electrode 11b. The interlayer insulating film 12 extends to cover the floating base region 5b and the base isolation region 5c. The emitter electrode 13 is placed to cover the interlayer insulation film 12. The emitter electrode 13 is physically in contact with the emitter region 6 and the low-resistance base contact region 7 through contact holes formed in the interlayer insulating film 12, as illustrated in FIGS. 2 and 3. For the interlayer insulating film 12, a silicon oxide film to which boron (B) and phosphorus (P) are added, that is BPSG, is used. The interlayer insulating film 12 may be a silicon oxide film with phosphorus (P) added, that is PSG, a non-doped silicon oxide ($SiO_2$) film called "NSG", in which phosphorus (P) or boron (B) is not contained, a silicon oxide film with boron (B) added, that is BSG, a $Si_3N_4$ film or the like. In addition, a laminated film of the above-mentioned dielectric films, may be used. The emitter electrode 13 may be composed of, for example, a nickel silicide ($NiSi_x$) film, a titanium nitride (TiN) film or a titanium (Ti) film, an aluminum (Al) film or an aluminum-silicon (Al—Si) film, and the like.

An n-type field stop layer (FS layer) 2 is located on a lower surface of the drift layer 3, and a p$^+$-type collector region 1 is located on a lower surface of the FS layer 2. A collector electrode 14 is formed on a lower surface of the collector region 1. For the collector electrode 14, for example, a single-layer metallic film made of gold (Au) or a metallic film laminated in the order of Ti, nickel (Ni) and Au may be used. The IGBT according to the embodiment can be realized using a silicon (Si) semiconductor substrate as a basis and a conventional semiconductor device manufacturing process.

During operation of the IGBT according to the embodiment, for example, a positive voltage is applied to the collector electrode 14 with the emitter electrode 13 as the ground potential. When the positive voltage above a threshold, such as +15 V, is applied to the gate electrode 11a, an inversion layer (channel) is created on the surface of the active base region 5a, which serves as an interface between the gate insulating film 10a in the gate trench 9a and the active base region 5a. A bipolar transistor implemented by the p-type active base region 5a, n-type layers of the accumulation region 4, the drift layer 3, and the FS layer 2, and the p-type collector region 1 operates using electrons supplied to the drift layer 3 via the inversion layer as a base current. When the IGBT is thus turned on, a current flows in the on-state from the collector electrode 14 to the emitter electrode 13 via the collector region 1, the FS layer 2, the drift layer 3, the accumulation layer 4, the inversion layer of the active base region 5a and the emitter region 6. When the voltage applied to the gate electrode 11a is below the threshold, no current flows from the collector electrode 14 to the emitter electrode 13 because no inversion layer is created in the active base region 5a.

In the IGBT according to the embodiment, the floating base region 5b is set at the floating potential, and no inversion layer is created in the floating base region 5b in contact with the gate trench 9a even in the on-state. In addition, since the dummy electrode 11b in the dummy trench 9b is electrically connected to the emitter potential, no inversion layer is created on the surface of the active base region 5a in contact with the side of the dummy trench 9b. Therefore, a channel density of the IGBT can be reduced and hole extraction can be suppressed. Furthermore, since the n-type accumulation layer 4 is arranged under the p-type active base region 5a, the accumulation of holes in the drift layer 3 is promoted. As a result, the on-voltage can be decreased.

Figure 4:
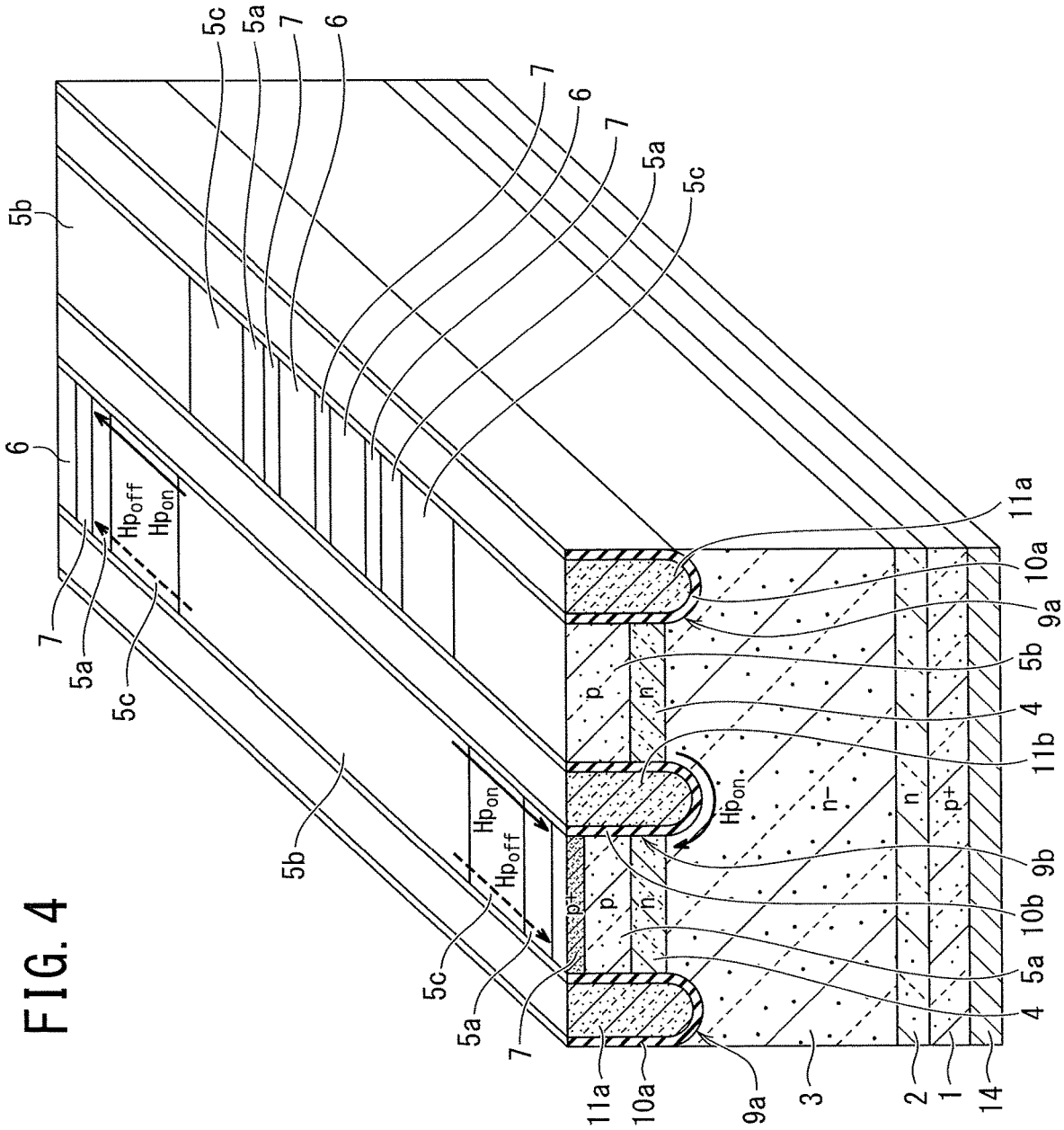
FIG. 4 is a schematic perspective view illustrating a hole extraction path of the IGBT according to the embodiment.

In the on-state of the IGBT according to the embodiment, as illustrated in FIG. 4, an extraction path $Hp_{on}$ is formed in the base isolation region 5c in contact with the side of the dummy trench 9b and in the drift layer 3 in contact with the bottom of the dummy trench 9b, respectively. Holes accumulated in the floating base region 5b are extracted through the extraction path $Hp_{on}$ to the low-resistance base contact region 7 in the active base region 5a. When a negative voltage below the threshold, such as −15 V, is applied to the gate electrode 11a to turn to off-state, an inversion layer that is a p-type channel is created on the surface of the base isolation region 5c in contact with the side of the gate trench 9a. Therefore, as illustrated in FIG. 4, an extraction path $Hp_{off}$ is formed in the base isolation region 5c along the side of the gate trench 9a. As a result, the excess holes accumulated in the floating base region 5b can be extracted via the extraction path $Hp_{off}$ during turn-on, and via the extraction path Hp$_{off}$ during turn-off. Thus, in the IGBT according to the embodiment, the potential change in the floating base region 5b can be suppressed to be moderated during the switching process, making it possible to easily control the voltage change dV/dt and preventing an increase in switching loss.

In the IGBT according to the embodiment, values of a capacitance C$_{GC}$ between gate and collector and a capacitance C$_{GE}$ between gate and emitter can be easily adjusted by adjusting a spacing between the active base region 5a and the floating base region 5b sandwiching the base isolation region 5c. The voltage change dV/dt is also easily controlled and a wide range of usages may be applicable. Furthermore, the IGBT according to the embodiment can achieve the low switching loss in a wide range of fixed driving conditions such as gate resistance in hard switching. Therefore, it can be used in a wide range of applications, for example, when the current capacity of the gate drive circuit is limited on the premise of satisfying noise specification or when only the IGBT of the power element is updated.

Figure 5:
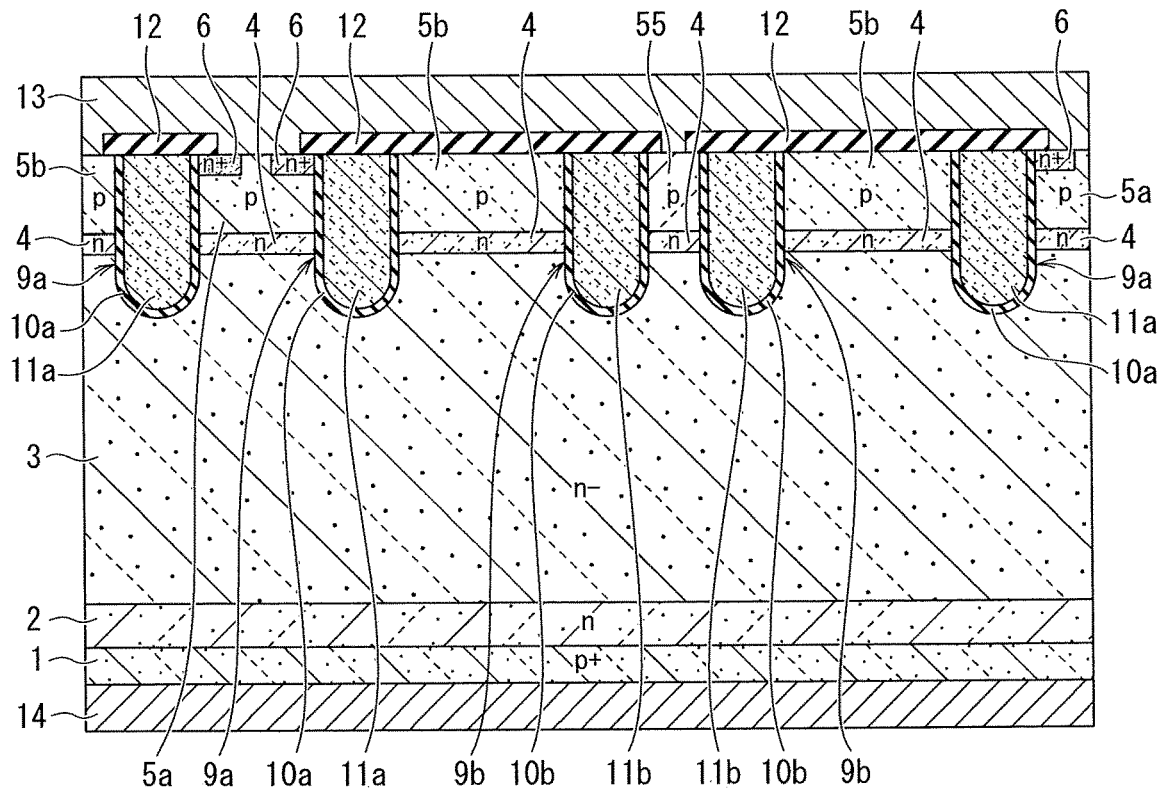
FIG. 5 is a schematic cross-sectional view illustrating an example of an IGBT of a comparative example 1.
Figure 6:
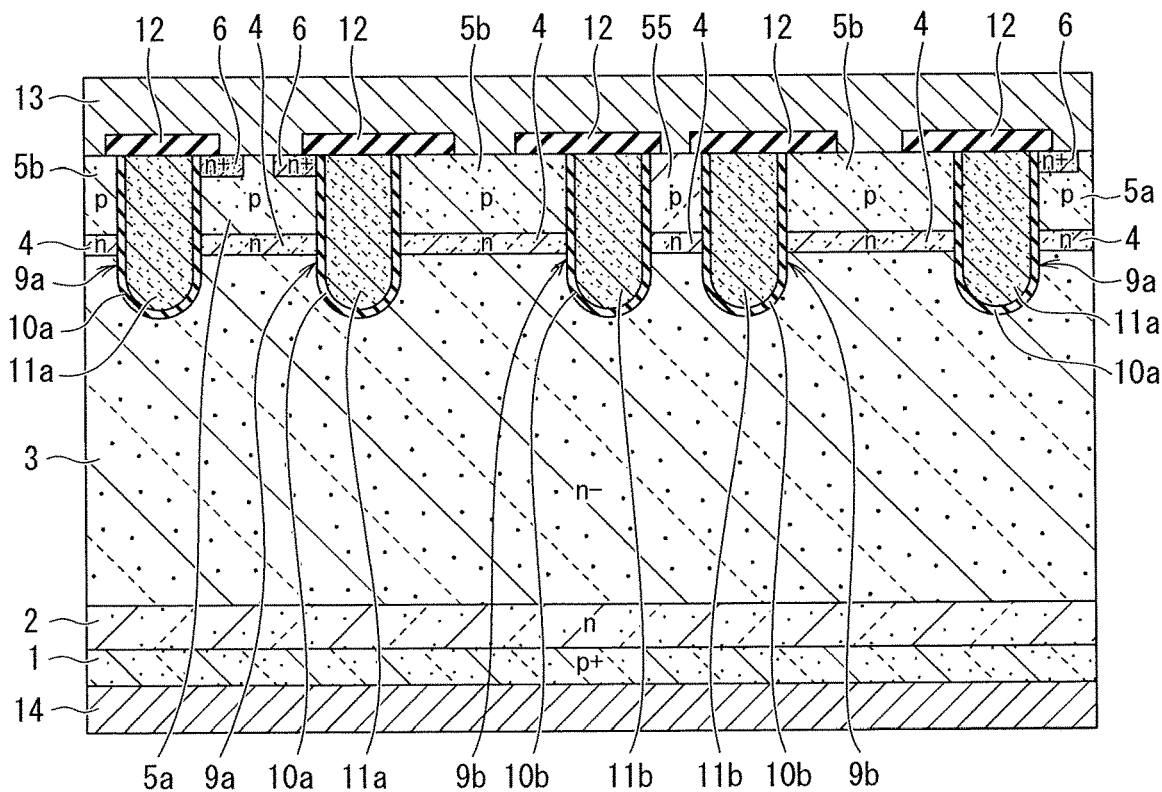
FIG. 6 is a schematic cross-sectional view illustrating an example of an IGBT of comparative example 2.

As an example, in the structure of the IGBT according to the embodiment, the turn-on characteristics have been evaluated with the impurity concentration of the accumulation layer 4 as $9\times10^{15}$ cm$^{-3}$ and $9\times10^{16}$ cm$^{-3}$, respectively. As a comparative example 1 and a comparative example 2, IGBTs with the structures illustrated in FIGS. 5 and 6 have been fabricated to evaluate the turn-on characteristics. As illustrated in FIGS. 5 and 6, in the comparative examples 1 and 2, a base layer (5a, 5b, 55) is formed on the upper surface of the accumulation layer 4. The p-type active base region 5a, the p-type floating base region 5b and a p-type intermediate region 55 in the base layer (5a, 5b, 55) are defined by the stripe-shaped trenches (9a, 9b) and formed into stripes, respectively. The active base region 5a is formed between the gate trenches 9a, and the emitter region 6 is formed separately in contact with each sidewall of the opposing gate trenches 9a. The floating base region 5b is formed between the gate trench 9a and the dummy trench 9b. The intermediate region 55 is formed between the dummy trenches 9b. In the comparative example 1, as illustrated in FIG. 5, each of the emitter region 6, the active base region 5a, and the intermediate region 55 is physically connected to the emitter electrode 13 through an opening formed in the interlayer insulating film 12, and the floating base region 5b is at floating potential. On the other hand, as illustrated in FIG. 6, in the comparative example 2, in addition to the emitter region 6, the active base region 5a and the intermediate region 55, the floating base region 5b is also physically connected to the emitter electrode 13 through an opening formed in the interlayer insulating film 12 and connected to the emitter potential.

Figure 7:
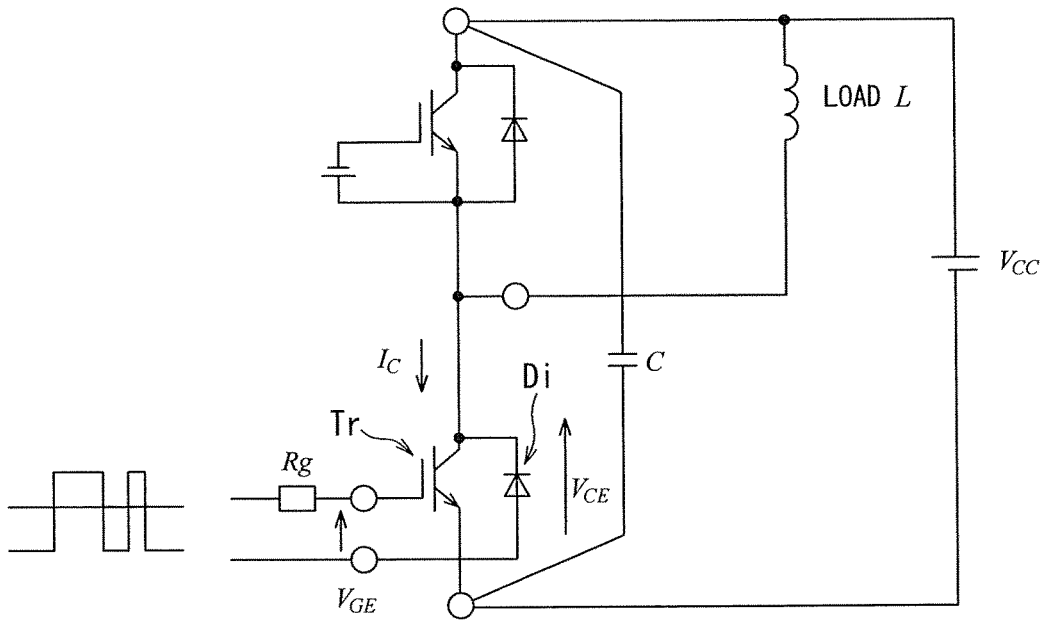
FIG. 7 is a circuit diagram illustrating an example of a measurement circuit for switching characteristics of the IGBT.

FIG. 7 illustrates a measurement circuit for evaluating the turn-on characteristics of the IGBT. As illustrated in FIG. 7, a freewheeling diode Di is connected in antiparallel to a transistor Tr to-be-measured. A pulse signal is applied from a gate drive circuit to a gate electrode of the transistor Tr to-be-measured via a gate resistance Rg. Each of the transistors Tr to-be-measured in the example, the comparative example 1 and the comparative example 2 used for the measurement, has been fabricated in the same way for all respective elements, such as an area of the active base region 5a, an area of the floating base region 5b and the base isolation region 5c or the intermediate region 55 in a minimum layout unit, except for the layout of the surface area, and each maximum rating is also the same.

Figure 8:
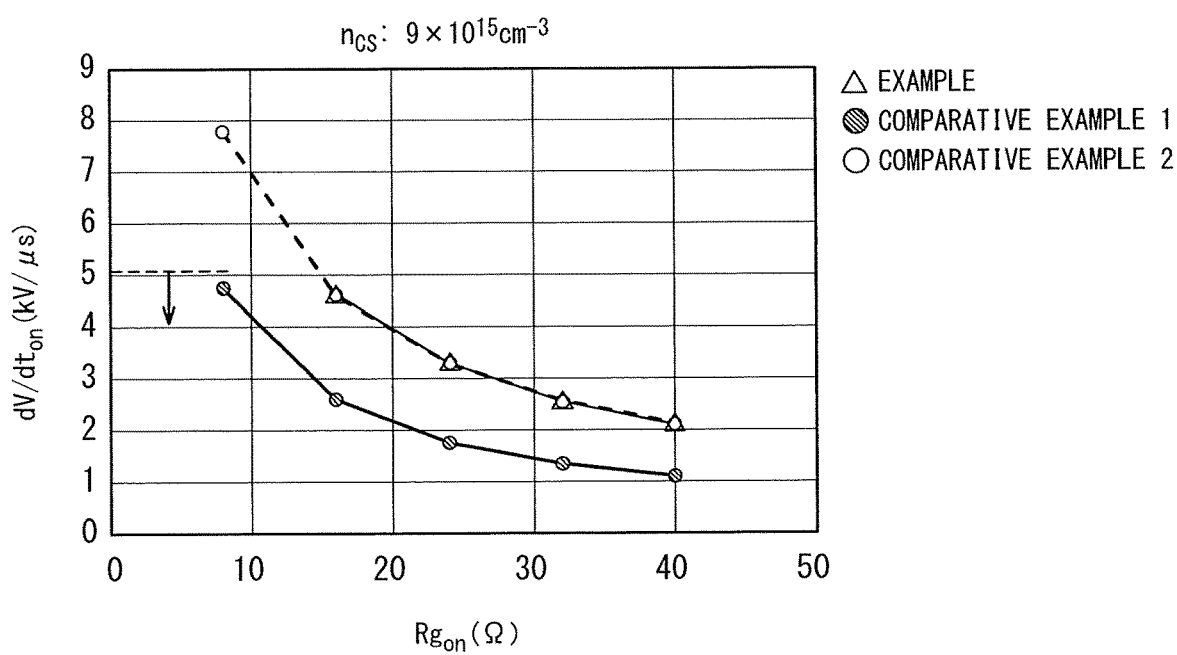
FIG. 8 is a graph illustrating an example of relationship between a rate of voltage change and a gate resistance of the IGBT according to the embodiment.
Figure 9:
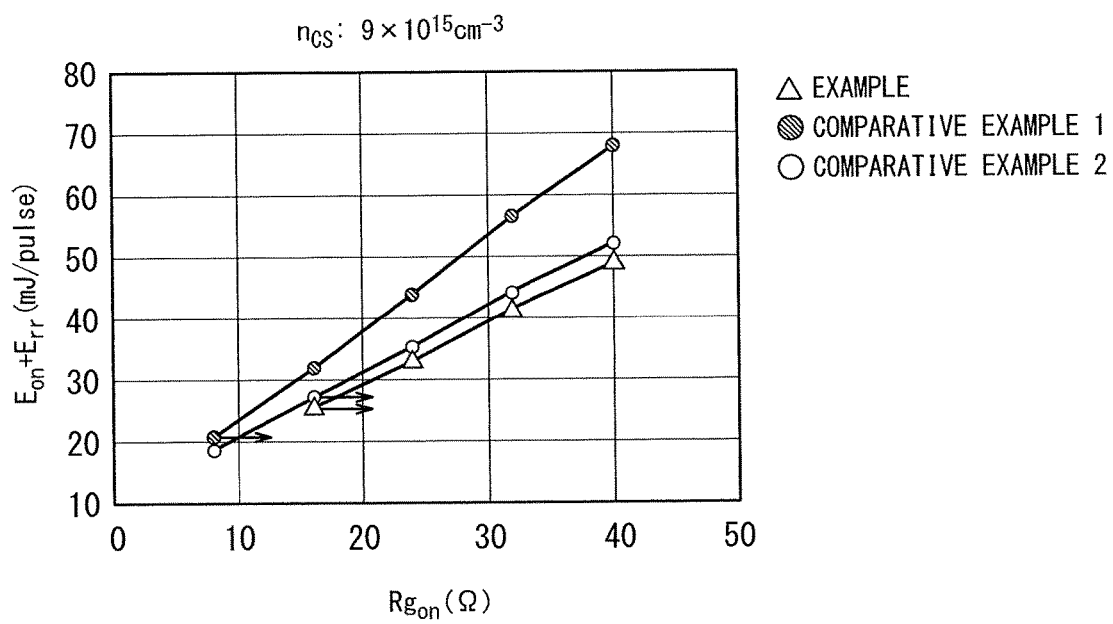
FIG. 9 is a graph illustrating an example of relationship between a switching loss and the gate resistance of the IGBT according to the embodiment.

FIGS. 8 and 9 illustrate relationships between the voltage changes dV/dt$_{on}$ and the switching losses (E$_{on}$+E$_{rr}$) of the transistors Tr to-be-measured and the gate resistances Rg$_{on}$ in the example, the comparative example 1 and the comparative example 2 for the case where an impurity concentration n$_{SC}$ in the accumulation layer 4 is $9\times10^{15}$ cm$^{-3}$. The switching loss (E$_{on}$+E$_{rr}$) is expressed as a sum of a turn-on loss E$_{on}$ of the transistor Tr to-be-measured and a reverse-recovery loss E$_{rr}$ of the freewheeling diode Di. As illustrated in FIG. 8, when driving with the voltage change dV/dt$_{on}$ controlled to 5 kV/µs or less, the gate resistance Rg$_{on}$ needs to be in a range of about 16Ω or more in the example and the comparative example 2, and about 8Ω or more in the comparative example 1. As illustrated in FIG. 9, the switching loss (E$_{on}$+E$_{rr}$) is smaller in the example than in the comparative example 1 and the comparative example 2, in a range of the gate resistance Rg$_{on}$ of about 16Ω or more. In the comparative example 1 and the comparative example 2, the switching loss (E$_{on}$+E$_{rr}$) is smaller than that in the example when the gate resistance Rg$_{on}$ is in a range of about 8Ω to about 12Ω.

Figure 10:
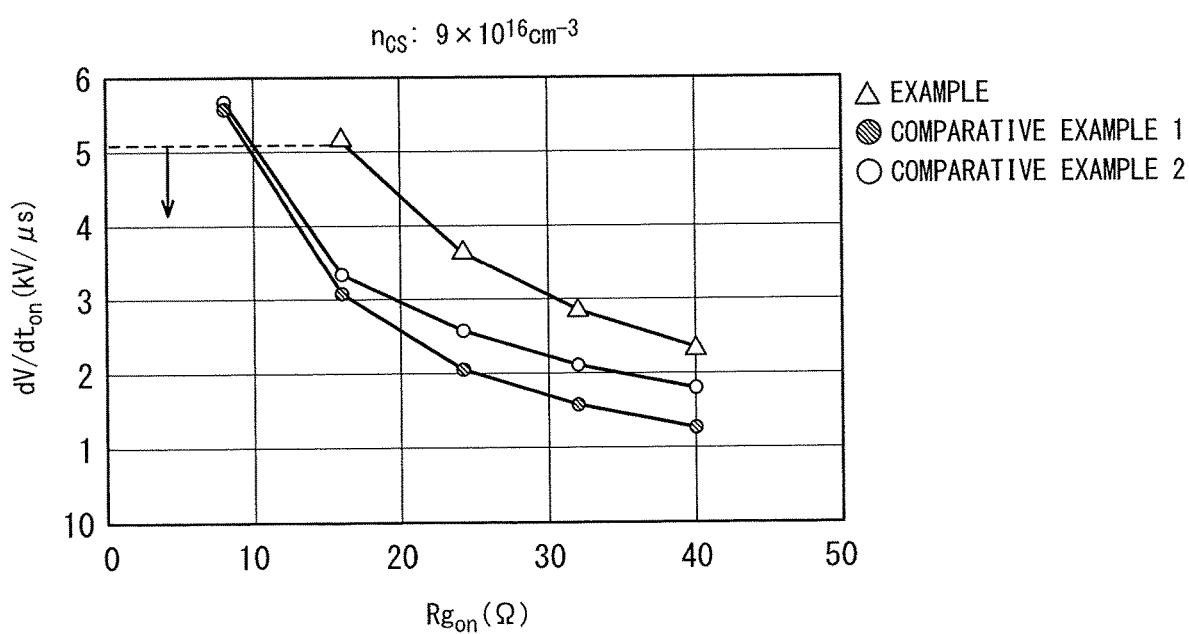
FIG. 10 is a graph illustrating another example of relationship between the rate of voltage change and the gate resistance of the IGBT according to an embodiment.
Figure 11:
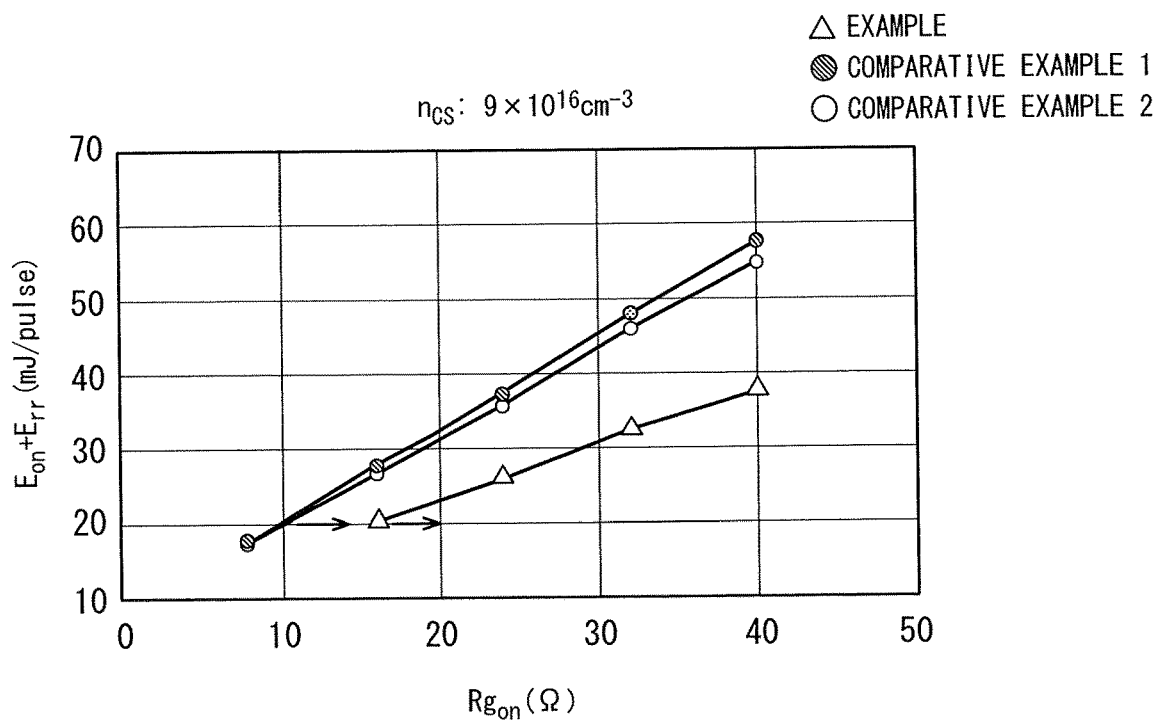
FIG. 11 is a graph illustrating another example of relationship between the switching loss and the gate resistance of the IGBT according to the embodiment.

FIGS. 10 and 11 illustrate relationships between the voltage changes dV/dt$_{on}$ and the switching losses (E$_{on}$+E$_{rr}$) of the transistors Tr to-be-measured and the gate resistances Rg$_{on}$ in the example, the comparative example 1 and the comparative example 2 for the case where the impurity concentration n$_{SC}$ in the accumulation layer 4 is $9\times10^{16}$ cm$^{-3}$. As illustrated in FIG. 10, when driving with the voltage change dV/dt$_{on}$ controlled to 5 kV/µs or less, the gate resistance Rg$_{on}$ needs to be in the range of about 16Ω or more in the example, and about 10Ω or more in the comparative examples 1 and 2. As illustrated in FIG. 11, the switching loss (E$_{on}$+E$_{rr}$) is smaller in the example than in the comparative examples 1 and 2 in a range of the gate resistance Rg$_{on}$ of about 16Ω or more. In the comparative examples 1 and 2, the voltage change dV/dt$_{on}$ is larger than kV/µs in a range of gate resistance Rg$_{on}$ of about 8Ω to 10Ω, but the switching loss (E$_{on}$+E$_{rr}$) is smaller than that in the example. As illustrated in FIGS. 8 to 11, in the comparative examples 1 and 2, the range of gate resistance Rg$_{on}$ where the switching loss (E$_{on}$+E$_{rr}$) can be reduced compared with the example, decreases as the impurity concentration in the accumulation layer 4 increases. Thus, in the structure of the IGBT according to the embodiment, it is possible to reduce the switching loss (E$_{on}$+E$_{rr}$) in a wide range of the fixed gate resistor Rg$_{on}$.

Figure 12:
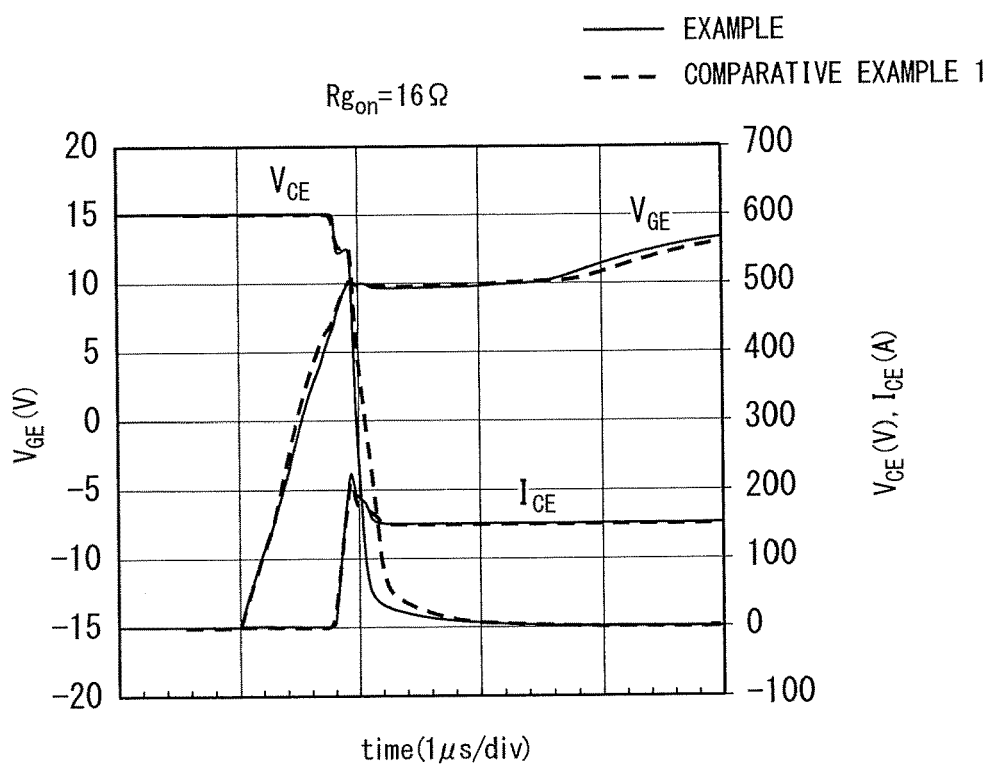
FIG. 12 is a graph illustrating an example of a turn-on waveform of the IGBT according to an embodiment.

FIG. 12 illustrates turn-on waveforms of the example and the comparative example 1 when the gate resistances Rg$_{on}$ are 16 ohms, where the impurity concentration n$_{SC}$ of the accumulation layer 4 is $9\times10^{16}$ cm$^{-3}$. As illustrated in FIG. 12, the waveform of the gate voltage V$_{GE}$ in the comparative example 1 shows a hump at the rise of the charging period of the gate-emitter capacitance. This hump is due to the potential of the floating base region 5b illustrated in FIG. 5. On the other hand, in the waveform of the gate voltage V$_{GE}$ in the example, the hump is suppressed and the turn-on voltage change dV/dt$_{on}$ is faster, reducing switching loss (E$_{on}$+E$_{rr}$). The switching loss (E$_{on}$+E$_{rr}$) has been 20.8 mJ in the example and 27.1 mJ in the comparative example 1.

Figures 13, 14:
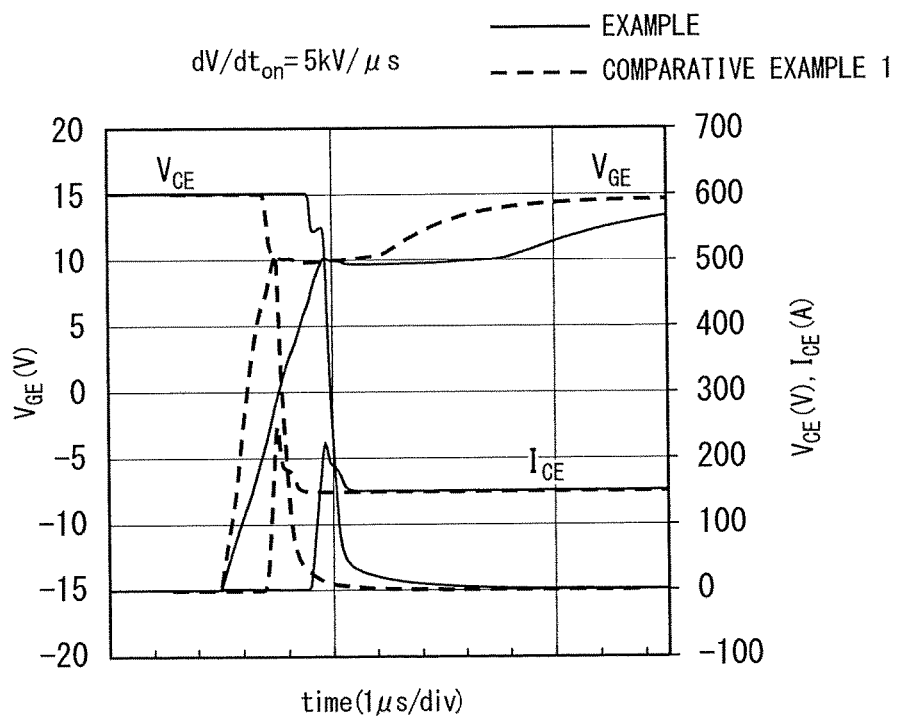
FIG. 13 is a graph illustrating another example of the turn-on waveform of the IGBT according to an embodiment.
FIG. 14 is a table illustrating an example of evaluation results of the IGBT according to the embodiment.

FIG. 13 illustrates the turn-on waveforms of the example and the comparative example 1 when the voltage changes dV/dt$_{on}$ are 5 kV/µs where the impurity concentration n$_{SC}$ of the accumulation layer 4 is $9\times10^{16}$ cm$^{-3}$. The switching losses (E$_{on}$+E$_{rr}$) have been similar, but the gate voltage change dV$_{GE}$/dt in the example has been lower. Thus, compared to the comparative example 1, the gate drive circuit in the example has a lower requirement for peak gate current.

FIG. 14 illustrates evaluation results of the example, the comparative example 1, and the comparative example 2 when the impurity concentration in the accumulation is $9 \times 10^{16}$ cm$^{-3}$ and $9 \times 10^{15}$ cm$^{-3}$. As illustrated in the table of FIG. 14, when the impurity concentration in the accumulation layer 4 is as low as $9 \times 10^{15}$ cm$^{-3}$, the on-voltages $V_{on}$ are 1.715 V for the example, and 1.695 V and 1.836 V for the comparative examples 1 and 2, respectively. The switching losses ($E_{on}+E_{rr}$) at the same voltage change $dV/dt_{on}$ of 5 kV/has are 24.99 mJ/pulse in the example, and 20.27 mJ/pulse and 26.95 mJ/pulse in the comparative examples 1 and 2, respectively. Both the on-voltage and the voltage change in the example are intermediate values between the comparative examples 1 and 2. When the impurity concentration in the accumulation layer 4 is $9 \times 10^{16}$ cm$^{-3}$, the on-voltage $V_{on}$ is 1.56 V in the example, and 1.513 V and 1.604 V in the comparative examples 1 and 2, respectively, and thus, the on-voltage in the example is an intermediate value between the comparative examples 1 and 2. On the other hand, the switching losses ($E_{on}+E_{rr}$) at the same voltage change $dV/dt_{on}$ of 5 kV/μs, are 20.8 mJ/pulse in the example and 20.1 mJ/pulse in both the comparative examples 1 and 2, and thus, the example is equivalent to the comparative examples 1 and 2. However, as illustrated in FIGS. 9, 11 and 12, the switching loss ($E_{on}+E_{rr}$) for the same gate resistance $Rg_{on}$ is smaller in the example than in the comparative examples 1 and 2. In the IGBT according to the embodiment, the switching loss can be reduced while suppressing the on-voltage.

Figure 15:
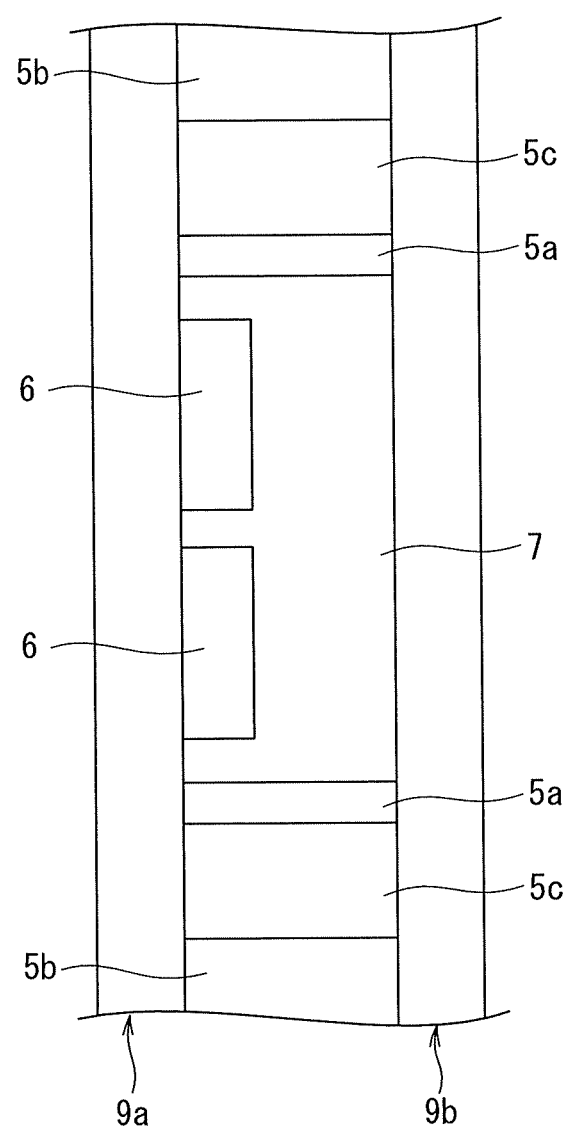
FIG. 15 is a schematic plan view illustrating another example of the layout of the source regions of the IGBT according to the embodiment.

As described above, both the emitter region 6 and the low-resistance base contact region 7 located in the upper portion of the active base region 5a are in contact with the opposing sides of the gate trench 9a and the dummy trench 9b, respectively. However, the layout of the emitter region 6 and the low-resistance base contact region 7 is not limited. For example, as illustrated in FIG. 15, in plan view, the emitter region 6 may be divided into two sections, each of which may be arranged so that only one side contacts the sidewall of the gate trench 9a and the other side is covered by the low-resistance base contact region 7 that contacts the respective sides of the gate trench 9a and dummy trench 9b. The emitter region 6 is provided with dividing into two sections in the low-resistance base contact region 7 in FIG. 15, but the emitter region 6 may be divided into three or more sections, or may be single without dividing.

Figure 16:
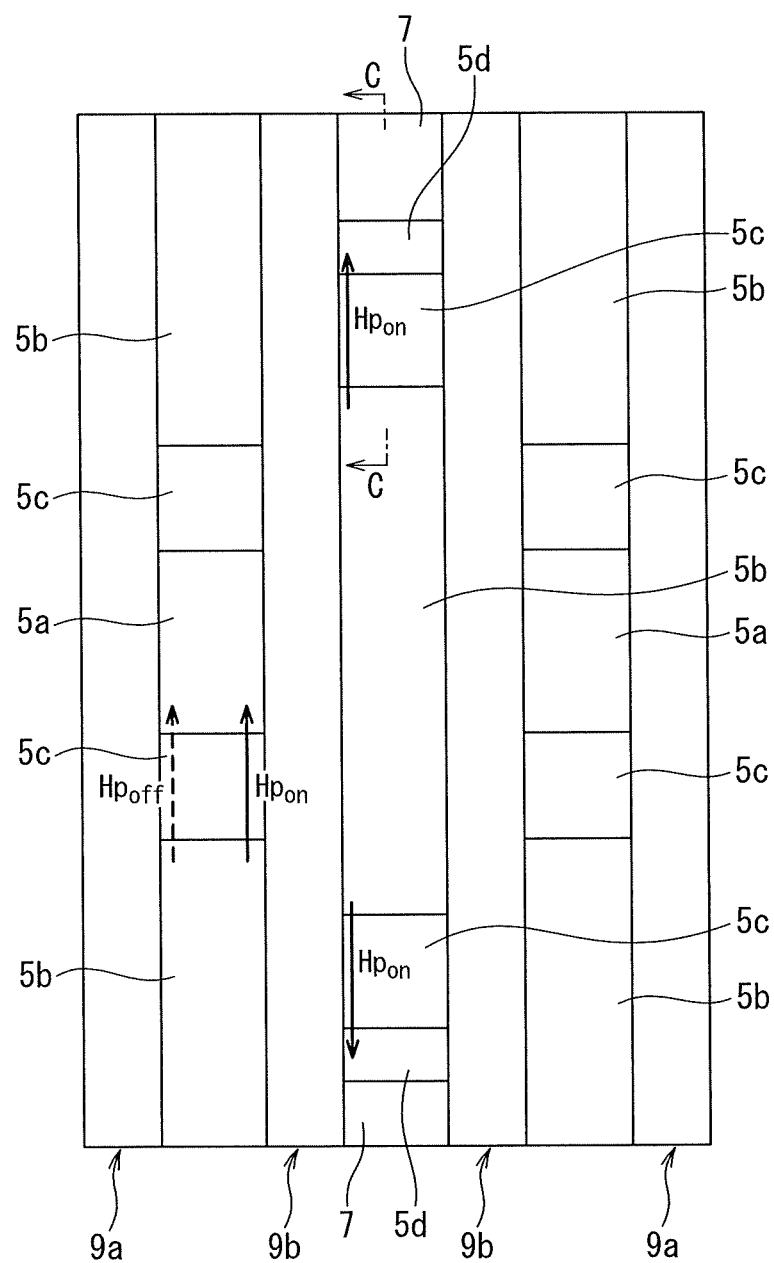
FIG. 16 is a schematic plan view illustrating another example of the layout of the base region of the IGBT according to the embodiment.
Figure 17:
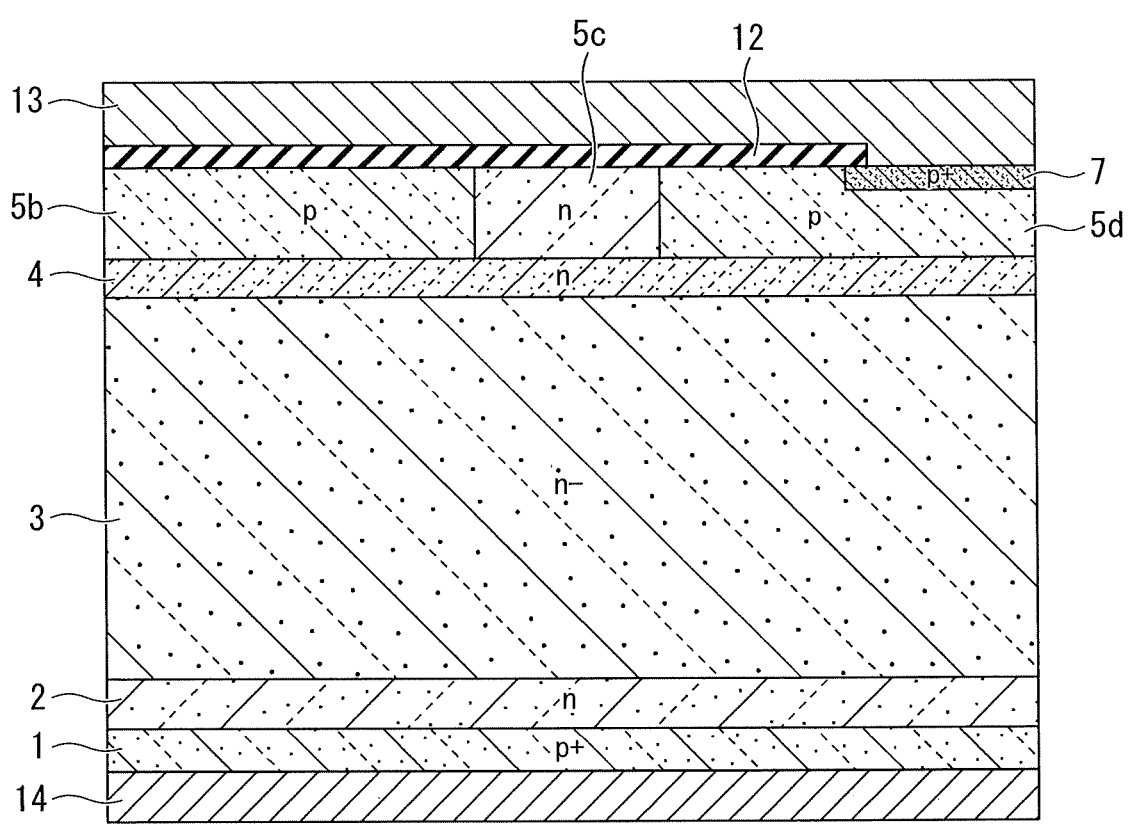
FIG. 17 is a schematic cross-sectional view taken along line C-C in FIG. 16.

In addition, as illustrated in FIG. 16, a plurality of, for example, two dummy trenches 9b may be arranged adjacent to each other between the gate trenches 9a. A base layer (5b, 5d) between adjacent dummy trenches 9b has the p-type floating base region 5b and a p-type extraction base region 5d. The base isolation region 5c is the n-type semiconductor layer. In the extending direction of the dummy trench 9b, the extraction base region 5d and the floating base region are alternately located so as to face each other through the base isolation region 5c. The active base region 5a between the gate trench 9a and the dummy trench 9b faces the floating base region 5b between the dummy trenches 9b. The floating base region 5b between the gate trench 9a and the dummy trench 9b faces the extraction base region 5d between the dummy trenches 9b. As illustrated in FIG. 17, the extraction base region 5d is separated from the floating base region 5b by the base isolation region 5c. In an upper portion of the extraction base region 5d, the p$^+$-type low-resistance base contact region 7 is selectively placed, which is physically connected to the emitter electrode 13 through a contact hole opened in the interlayer insulation film 12. Thus, the extraction base region 5d is connected to the emitter potential.

In the on-state of the IGBT according to the embodiment, the extraction path Hp$_{on}$ is formed in each of the base isolation regions 5c in contact with the sides of the respective dummy trenches 9b, as illustrated in FIG. 16. Holes accumulated in the floating base region 5b between the gate trench 9a and the dummy trench 9b are extracted through the extraction paths Hp$_{on}$ facing the gate trench 9b to the low-resistance base contact region 7 in the active base region 5a. Holes accumulated in the floating base region 5b between the dummy trenches 9b are extracted through the extraction path Hp$_{on}$ facing the adjacent dummy trench 9b to the low-resistance base contact region 7 in the extraction base region 5d. Thus, since the density of the extraction paths Hp$_{on}$ formed on the sides of the dummy trench 9b increases, the excess holes accumulated in the floating base region 5b can be efficiently extracted via the extraction path Hp$_{on}$ on both sides of the dummy trench 9b. In the off-state, the extraction path Hp$_{off}$ is formed on the side of the gate trench 9a. As a result, in the IGBT according to the embodiment, the potential change in the floating base region can be suppressed to be moderated during the switching process, making it possible to easily control the voltage change dV/dt and preventing an increase in switching loss.

Figure 18:
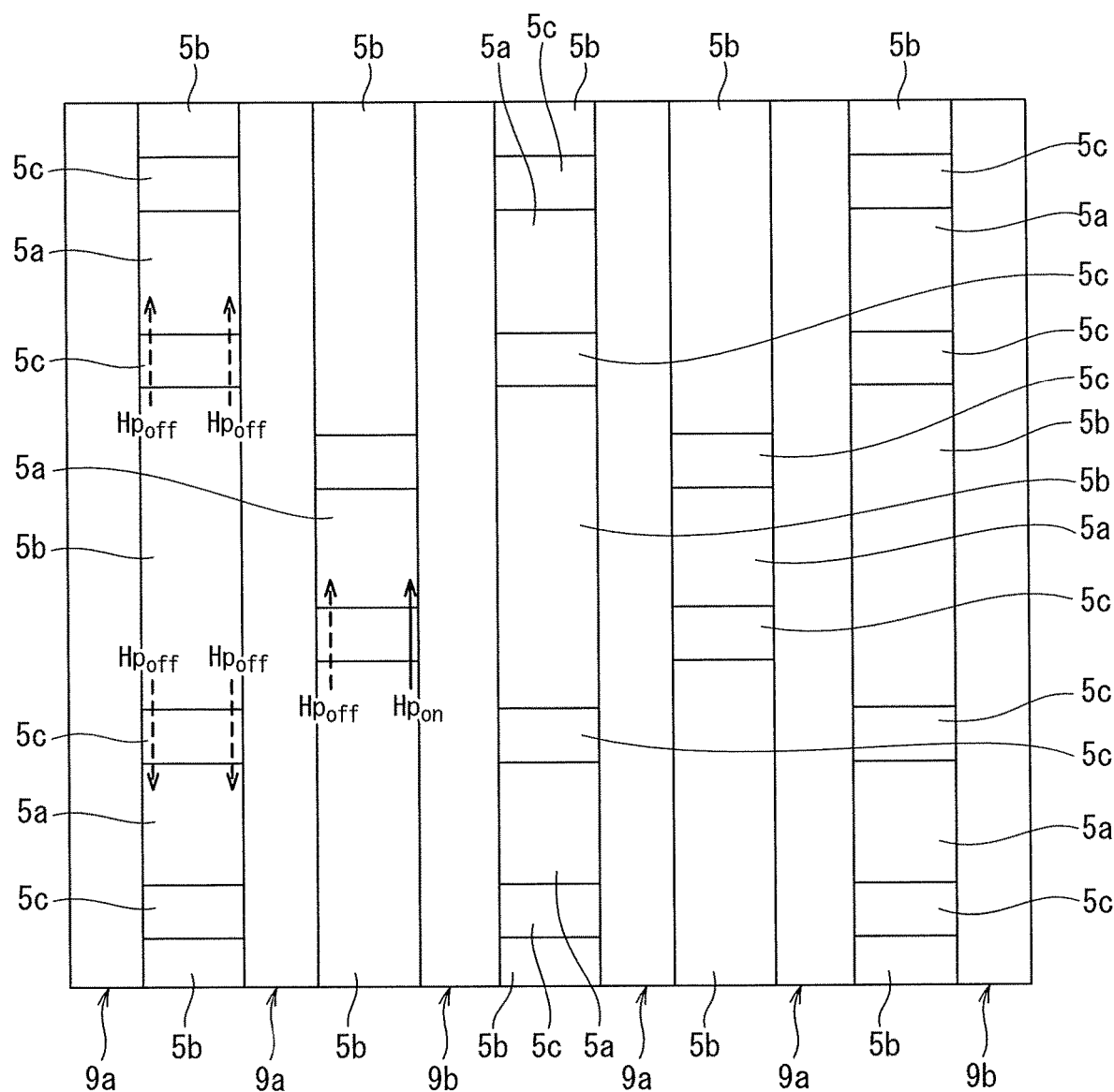
FIG. 18 is a schematic plan view illustrating another example of the layout of the base region of the IGBT according to the embodiment.

In addition, as illustrated in FIG. 18, a plurality of, for example, two gate trenches 9a may be arranged adjacent to each other between the dummy trenches 9b. The floating base region 5b sandwiched by the adjacent gate trenches 9a faces the active base region 5a sandwiched by the gate trench 9a and the dummy trench 9b. The active base region 5a sandwiched by the adjacent gate trenches 9a faces the floating base region 5b sandwiched by the gate trench 9a and the dummy trench 9b. In the on-state of the IGBT, the extraction path Hp$_{on}$ is formed on the side of the dummy trench 9b. In the off-state, the extraction paths Hp$_{off}$ are formed on the sides of the gate trenches 9a. The extraction path Hp$_{off}$ is formed not only between the gate trench 9a and the dummy trench 9b but also between the gate trenches 9a, and the density of the extraction paths Hp$_{off}$ increases. Therefore, holes remaining in the floating base region 5b in the off-state can be efficiently extracted via the extraction path Hp$_{off}$. As a result, in the IGBT according to the embodiment, the potential change in the floating base region can be suppressed to be moderated during the switching process, making it possible to easily control the voltage change dV/dt and preventing an increase in switching loss.

Other Embodiments

While the present invention has been described by the above disclosed embodiments, it should be understood that the present invention is not intended to be limited to the descriptions of the Specification and the drawings implementing part of this disclosure. Various alternative embodiments, examples, and technical applications will be apparent to those skilled in the art according to this disclosure.

Although silicon (Si) has been used as the material of the semiconductor substrate in the embodiments described above, the semiconductor material is not limited and may be a wide bandgap semiconductor such as silicon carbide (SiC) or gallium nitride (GaN). The IGBT is not limited to a single IGBT, but may be a reverse-conducting IGBT integrated with a freewheeling diode.

As described above, it should be noted that the present invention includes various embodiments which are not disclosed herein. Therefore, the scope of the present invention is defined only by "the technical features specifying the invention" prescribed by the claims reasonably derived from the description heretofore.

What is claimed is:

1. An insulated gate bipolar transistor comprising:
a drift layer of a first conductivity type;
an accumulation layer of the first conductivity type arranged on an upper surface of the drift layer, having an impurity concentration higher than an impurity concentration of the drift layer;
a base layer arranged on an upper surface of the accumulation layer;
a gate electrode embedded through a gate insulating film inside a stripe-shaped gate trench penetrating the base layer and the accumulation layer;
a dummy electrode embedded through a dummy insulating film inside a stripe-shaped dummy trench penetrating the base layer and the accumulation layer; and
an emitter region of the first conductivity type arranged in an upper portion of the base layer, having a higher impurity concentration than the drift region, wherein
the base layer includes an active base region of a second conductivity type in which the emitter region is arranged in the upper portion, connected to emitter potential, a floating base region of the second conductivity type set at floating potential, and a base isolation region of the first conductivity type isolating the active base region and the floating base region, and
in a mesa provided between the gate trench and the dummy trench, the active base region and the floating base region are alternately arranged via the base isolation region in an extending direction of the gate trench.

2. The insulated gate bipolar transistor according to claim 1, wherein the active base region faces the floating base region across the dummy trench.

3. The insulated gate bipolar transistor according to claim 1, wherein the active base region faces the other active base region across the gate trench.

4. The insulated gate bipolar transistor according to claim 1, wherein the active base region faces the floating base region across the gate trench.

5. The insulated gate bipolar transistor according to claim 1, wherein an impurity concentration of the base isolation region is higher than or equal to the impurity concentration of the drift layer and less than or equal to the impurity concentration of the accumulation layer.

6. The insulated gate bipolar transistor according to claim 5, wherein the impurity concentration of the base isolation region is more than or equal to $1\times10^{16}$ cm$^{-3}$ and less than or equal to $1\times10^{17}$ cm$^{-3}$.

7. The insulated gate bipolar transistor according to claim 1, wherein,
the base layer further includes an extraction base region of the second conductivity type in which the emitter region is not arranged, connected to the emitter potential, and
in a mesa provided between the dummy trenches adjacent to each other, the extraction base region and the floating base region are alternately arranged via the base isolation region in an extending direction of the dummy trench.

8. The insulated gate bipolar transistor according to claim 1, wherein the emitter region and a low-resistance base contact region of the second conductivity type having a higher impurity concentration than the active base region are selectively arranged on an upper portion of the active base region in contact with each other.

9. The insulated gate bipolar transistor according to claim 8, wherein both the emitter region and the low-resistance base contact region are in contact with the dummy trench and the gate trench.

10. The insulated-gate bipolar transistor according to claim 8, wherein,
in plan view, only one side of the emitter region contacts the gate trench, and
the low-resistance base contact region contacts the dummy trench and the gate trench to cover other sides of the emitter region.

11. The insulated gate bipolar transistor according to claim 8, wherein in the extending direction of the gate trench, the low-resistance base contact region is arranged closer to the base isolation region than the emitter region.

* * * * *